United States Patent
Tounai et al.

(10) Patent No.: US 7,058,923 B2
(45) Date of Patent: Jun. 6, 2006

(54) OPTICAL PROXIMITY EFFECT CORRECTING METHOD AND MASK DATA FORMING METHOD IN SEMICONDUCTOR MANUFACTURING PROCESS, WHICH CAN SUFFICIENTLY CORRECT OPTICAL PROXIMITY EFFECT, EVEN UNDER VARIOUS SITUATIONS WITH REGARD TO SIZE AND SHAPE OF DESIGN PATTERN, AND SPACE WIDTH AND POSITION RELATION BETWEEN DESIGN PATTERNS

(75) Inventors: Keiichiro Tounai, Tokyo (JP); Takeshi Hamamoto, Tokyo (JP)

(73) Assignee: NEC Electronics Corporation (JP)

( * ) Notice: Subject to any disclaimer, the term of this patent is extended or adjusted under 35 U.S.C. 154(b) by 886 days.

(21) Appl. No.: 10/011,421

(22) Filed: Dec. 4, 2001

(65) Prior Publication Data
US 2002/0043615 A1 Apr. 18, 2002

Related U.S. Application Data

(62) Division of application No. 09/458,625, filed on Dec. 10, 1999.

(30) Foreign Application Priority Data
Dec. 14, 1998 (JP) .......................................... 10-355239

(51) Int. Cl.
*G06F 17/50* (2006.01)

(52) U.S. Cl. ............................................. 716/19; 430/5
(58) Field of Classification Search .................. 716/19, 716/20, 21; 430/5, 30
See application file for complete search history.

(56) References Cited

U.S. PATENT DOCUMENTS

| | | | | |
|---|---|---|---|---|
| 5,994,009 A | * | 11/1999 | Tzu et al. | 430/30 |
| 6,214,494 B1 | * | 4/2001 | Bula et al. | 430/5 |
| 6,289,499 B1 | * | 9/2001 | Rieger et al. | 716/21 |
| 6,425,117 B1 | * | 7/2002 | Pasch et al. | 716/21 |
| 6,470,489 B1 | * | 10/2002 | Chang et al. | 716/21 |
| 6,519,759 B1 | * | 2/2003 | Tounai | 716/19 |
| 6,570,174 B1 | * | 5/2003 | Tounai et al. | 250/559.26 |

FOREIGN PATENT DOCUMENTS

| | | |
|---|---|---|
| JP | 9-127677 | 5/1997 |
| JP | 9-292701 | 11/1997 |
| JP | 10-148928 | 6/1998 |
| JP | 10-189409 | 7/1998 |
| JP | 10-069058 | 10/1998 |
| JP | 10-289861 | 10/1998 |

* cited by examiner

*Primary Examiner*—Stacy Whitmore
(74) *Attorney, Agent, or Firm*—Hayes Soloway P.C.

(57) ABSTRACT

An optical proximity effect correcting method in a semiconductor manufacturing process includes adding, detecting, judging, and deleting. The adding includes adding a first correcting region around a portion of a first design pattern. The portion faces a second design pattern. A first corrected design pattern includes the first correcting region and the first design pattern. The detecting includes detecting a space between the first corrected design pattern and the second design pattern. The judging includes judging whether the space is smaller than or equal to a predetermined value. The deleting includes deleting at least a portion of the first correcting region such that the space is larger than the predetermined value, when the space is smaller than or equal to the predetermined value.

3 Claims, 20 Drawing Sheets

$W_{11} > W_{22}$
$L_1 > L_2$

OPTICAL PROXIMITY EFFECT CORRECTING METHOD AND MASK DATA FORMING METHOD IN SEMICONDUCTOR MANUFACTURING PROCESS, WHICH CAN SUFFICIENTLY CORRECT OPTICAL PROXIMITY EFFECT, EVEN UNDER VARIOUS SITUATIONS WITH REGARD TO SIZE AND SHAPE OF DESIGN PATTERN, AND SPACE WIDTH AND POSITION RELATION BETWEEN DESIGN PATTERNS

This application is a division of Ser. No. 09/458,625 filed Dec. 10, 1999.

BACKGROUND OF THE INVENTION

1. Field of the Invention

The present invention relates to an optical proximity effect correcting method and a mask data forming method in a semiconductor manufacturing process.

2. Description of the Related Art

In an optical lithography process of a semiconductor device manufacturing process, an optical proximity effect is incurred. The optical proximity effect implies that exposure transcription cannot be carried out accurately in the same shape due to light interference between proximity lights adjacent to each other. Therefore, it is required to reduce pattern dimension error caused by such optical proximity effect. The reduction of the pattern dimension error is compensated by correcting the proximity effect, as known in Japanese Laid Open Patent Application (JP-A-Heisei 5-80486). This correction technique is the calculation technique of modifying a line width of a correction target pattern through calculation, as known in Japanese Patent Publication 2616467.

As a technique of correcting the proximity effect, a technique disclosed by Oberdan W. Otto et al, entitled [Optical/Laser Microlithography VII, Vol. 2197, SPIE Symposium on Microlithography 1994], pages 1–16, in a name of [Automated optical proximity correction—a rules—based approach] is well known.

In an actual pattern design, there are various sizes (wiring widths) of design patterns, and there are also various space widths and position relations between the design patterns. Here, the combination of a wiring pattern and a contact pattern makes its pattern shape further variable.

If the proximity effect is corrected under such situation, there may be a case that the sufficient proximity effect correction cannot be attained only by adding a correcting pattern having a certain shape to each of the various design patterns. In this case, it may be considered to limit a design rule so that there is no occurrence of the insufficient correction after the addition of the correcting pattern having the certain shape. However, a method of limiting a design rule and a method of validating a design method are not still established. Also, such limitation and validation may result in a drop of design efficiency and largely increase validation process time.

Japanese Laid Open Patent Application (JP-A-Heisei 10-69058) discloses the following technique with regard to an optical proximity correcting method. Not only the optical proximity correction is limited to electrically related structure, but also the individual shape edges are processed. Thus, accuracy of the correction is improved, and also the occurrence of irregularity in design is avoided to thereby reduce the influence on mask manufacture to a minimum. An important edge area in the electrical related structure is analyzed, sorted and processed to thereby receive the optical proximity correction.

Japanese Laid Open Patent Application (JP-A-Heisei 8-321450) discloses the following technique with regard to a mask pattern correcting method. In a mask pattern correcting method for a photo mask used when a pattern is projected to and exposed on a substrate, if a first mask pattern and a second mask pattern adjacent to each other under a certain distance are formed on the photo mask, a pattern correction data is generated by using a shift amount induced at a time of exposing the first mask pattern and the second mask pattern on the substrate and a shift amount induced at a time of etching. Then, a side of the first mask pattern is moved in accordance with a correction amount corresponding to a distance between the first and second mask patterns.

Japanese Laid Open Patent Application (JP-A-Heisei 10-239826) discloses the following technique with regard to a photo mask pattern designing apparatus. It is provided with: a pattern condition input device used for an input of a pattern design rule which implies a condition to extract a photo mask pattern portion to be optimized in a usual photo mask pattern; a pattern extracting device for extracting a pattern cell before the correction of an optical proximity effect, which does not meet the pattern design rule and on which the optical proximity effect correction should be performed; an optical strength simulator for repeatedly performing an optical strength simulation on a pre-optimization pattern cell for a plurality of times; and a pattern optimizing device for optimizing the pattern cell before the correction of the optical proximity effect, in accordance with the plurality of simulation results.

Japanese Laid Open Patent Application (JP-A-Heisei 2-189913) discloses the following technique with regard to a method of forming a pattern of a semiconductor device. This method of forming the pattern comprises: a step of preliminarily forming the patterns by using the elements in which mask patterns where proximity effects occur are formed in advance in various dimensions, when forming the patterns of a semiconductor device by using a mask containing a mask pattern where the proximity effect occurs and a mask pattern where the proximity effect does not occur; a step of determining a relation between the dimensions of these masks and the actually-measured dimensions of the formed patterns; and a step of determining a mask dimension corresponding to a pattern dimension required from the determined relation and accordingly correcting the dimension of the mask pattern in accordance with a difference between both the pattern dimensions.

Japanese Laid Open Patent Application (JP-A-Heisei 10-104818) discloses the following technique with regard to an optical proximity effect correcting method. This method determines an area rate judgment standard as to whether or not it is necessary to correct an optical proximity effect and a judgment distance which receives the influence of the optical proximity effect from another exposure point of an exposure point on the basis of an optical condition in an exposing apparatus in which a photo mask is mounted. This method divides each side of a photo mask pattern into division sides, each equal to or less than a preset length. This method determines an area rate occupied by the photo mask pattern in which a radius centered at a middle point on each division side belongs to a circle of the judgment distance, for each division side. Then, this method compares the area rate of each division side with the area rate judgment standard, and accordingly judges whether or not it is necessary to correct the optical proximity effect for each division side.

SUMMARY OF THE INVENTION

The present invention has been made to solve the above-described problems of the conventional optical proximity effect correcting method. An object of the present invention is to provide an optical proximity effect correcting method and a mask data forming method in a semiconductor manufacturing process, which can sufficiently correct an optical proximity effect even under various situations with regard to a size and a shape of a design pattern, and a space width and a position relation between the design patterns.

In order to achieve an aspect of the present invention, an optical proximity effect correcting method in a semiconductor manufacturing process, includes adding a first correcting region around a portion of a first design pattern, the portion facing a second design pattern, and a first corrected design pattern including the first correcting region and the first design pattern; detecting a space between the first corrected design pattern and the second design pattern; judging whether the space is smaller than or equal to a predetermined value; and deleting at least a portion of the first correcting region such that the space is larger than the predetermined value, when the space is smaller than or equal to the predetermined value.

In order to achieve another aspect of the present invention, an optical proximity effect correcting method in a semiconductor manufacturing process, includes: adding a first correcting region around a portion of a first design pattern, the portion facing a second design pattern, and a first corrected design pattern including the first correcting region and the first design pattern; adding a second correcting region around a portion of the second design pattern, the portion facing the first design pattern, and a second corrected design pattern including the second correcting region and the second design pattern; detecting a space between the first corrected design pattern and the second corrected design pattern; judging whether the space is smaller than or equal to a predetermined value; and deleting at least a portion of at least one of the first and second correcting regions such that the space is larger than the predetermined value, when the space is smaller than or equal to the predetermined value.

In this case, the predetermined value is determined based on a resolution of an exposing apparatus when the first corrected design pattern and the second design pattern are exposed by the exposing apparatus.

Also in this case, the predetermined value is determined based on a resolution of an exposing apparatus when the first and second corrected design patterns are exposed by the exposing apparatus.

Further in this case, the first design pattern has a substantially rectangular region, and the optical proximity effect correcting method, further includes: detecting a remaining region of the first correcting region, the remaining region having a dimension smaller than or equal to a specific value; and deleting the remaining region from the first correcting region.

In this case, an optical proximity effect correcting method, further includes: detecting a remaining region of each of the first and second correcting regions, each of the first and second correcting regions having a dimension smaller than or equal to a specific value; and deleting the remaining region from each of the first and second correcting regions.

Also in this case, the remaining region is a region which remains after deleting at least a portion of the first correcting region.

Further in this case, the remaining region is a region which remains after deleting at least a portion of the at least one of the first and second correcting regions.

In this case, the first correcting region is a single region to surround an end portion of the first design pattern.

Also in this case, the first correcting region is a single region to surround an end portion of the first design pattern, and the second correcting region is a single region to surround an end portion of the second design pattern.

In order to achieve still another aspect of the present invention, an optical proximity effect correcting method in a semiconductor manufacturing process, includes: detecting a plurality of corner portions included in a pattern; detecting, as a first side, one of sides provided between the plurality of corner portions; detecting a second side parallel with the first side in the pattern; detecting at least one of the plurality of corner portions contacting at least one of the first and second sides, as a specific corner portion; detecting a length of a side, as a specific side, adjacent to and normal to one of the first and second sides; judging whether the detected length is larger than or equal to a predetermined value; extending the first side to a position corresponding to the specific corner portion in contact with the specific side to form a third side when the detected length is larger than or equal to the predetermined value; determining a correcting region based on the third side; and adding the correcting region to the pattern.

In this case, an optical proximity effect correcting method, further includes: designating a region around a specific pattern, at least a portion of which is in contact with the pattern; and wherein each of the steps of the optical proximity effect correcting method is performed in the designated region, and the pattern is a wiring pattern and the specific pattern is one of a contact pattern and a through hole pattern.

Also in this case, an optical proximity effect correcting method, further includes: designating a region around a specific pattern, at least a portion of which is in contact with the pattern; and wherein each of the steps of the optical proximity effect correcting method is performed in the designated region, and the pattern is a contact pattern and the specific pattern is a gate pattern.

Further in this case, the designated region is surrounded with the specific pattern.

In order to achieve yet still another aspect of the present invention, a mask data forming method in a semiconductor manufacturing process, includes: adding a correcting region to a design pattern based on a first data indicating at least a portion of the design pattern to form a first corrected pattern; correcting the correcting region based on a second data different from the first data to form a second corrected pattern; generating a mask data based on the second corrected pattern; and detecting a defect of the mask data, and wherein the correcting includes correcting the correcting region such that a data indicating one of a projection portion and a concave portion which are smaller than a predetermined size, is not detected as the defect.

In order to achieve another aspect of the present invention, a mask data forming method in a semiconductor manufacturing process, includes: adding a correcting region to a design pattern based on a first data indicating at least a portion of the design pattern to form a first corrected pattern; and correcting the correcting region of the first corrected pattern based on a second data different from the first data to form a second corrected pattern; generating a mask data based on the second corrected pattern, and wherein the correcting includes deleting at least a portion of the correcting region such that a space between the correcting region and one of another design pattern and another first corrected pattern is not smaller than a predetermined value.

In order to achieve still another aspect of the present invention, a computer readable recording medium for recording a program for a process includes: adding a first correcting region around a portion of a first design pattern, the portion facing a second design pattern, and a first corrected design pattern including the first correcting region and the first design pattern; detecting a space between the first corrected design pattern and the second design pattern; judging whether the space is smaller than or equal to a predetermined value; and deleting at least a portion of the first correcting region such that the space is larger than the predetermined value, when the space is smaller than or equal to the predetermined value.

In order to achieve yet still another aspect of the present invention, a computer readable recording medium for recording a program for a process includes: adding a first correcting region around a portion of a first design pattern, the portion facing a second design pattern, and a first corrected design pattern including the first correcting region and the first design pattern; adding a second correcting region around a portion of the second design pattern, the portion facing the first design pattern, and a second corrected design pattern including the second correcting region and the second design pattern; detecting a space between the first corrected design pattern and the second corrected design pattern; judging whether the space is smaller than or equal to a predetermined value; and deleting at least a portion of at least one of the first and second correcting regions such that the space is larger than the predetermined value, when the space is smaller than or equal to the predetermined value.

In this case, the predetermined value is determined based on a resolution of an exposing apparatus when the first corrected design pattern and the second corrected design pattern are exposed by the exposing apparatus.

Also in this case, the predetermined value is determined based on a resolution of an exposing apparatus when the first and second corrected design patterns are exposed by the exposing apparatus.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Embodiments of an optical proximity effect correcting method according to the present invention will be described below with reference to the attached drawings.

It should be noted that there is a copending U.S. patent application Ser. No. 09/441,487, entitled "METHOD FOR CORRECTING PHOTO-CONTIGUOUS EFFECT DURING MANUFACTURE OF SEMICONDUCTOR DEVICE", now U.S. Pat. No. 6,174,633, invented by Kei-ichiro Tounai who is one of the inventors of the present application, and assigned to an assignee who is an assignee of the present application. The content of the copending U.S. application is incorporated herein by reference.

At first, a first embodiment is described.

This embodiment is a technique for modifying a wiring pattern in a layout data which is not yet modified, to generate a mask drawing data based on the modified wiring pattern, in accordance with the optical proximity effect correcting method of the semiconductor manufacturing process.

Figure 1:
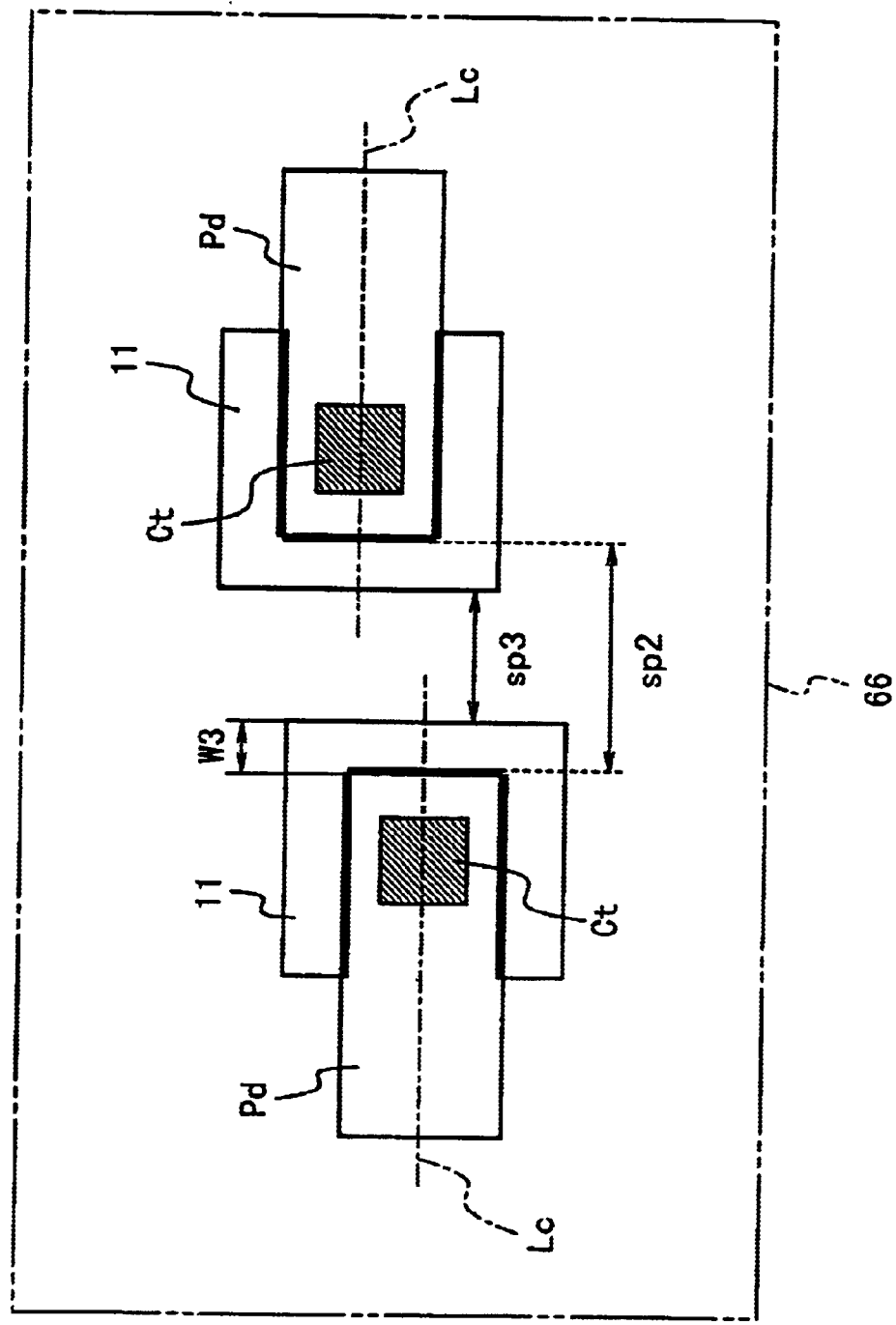
FIG. 1 is a plan view showing a step of a first embodiment of an optical proximity effect correcting method in a semiconductor manufacturing process according to the present invention.

As shown in FIG. 1, a computer 66 stores therein the layout data which is not yet modified. The layout data which is not yet modified includes a wiring (design pattern) Pd which is a wiring layer pattern or an element thereof and a contact Ct which is a contact layer pattern or an element thereof.

The design pattern Pd is designed at an interval equal to or greater than a minimum space width sp2 (for example, 0.18 μm or 0.24 μm) defined in accordance with a minimum design rule. A single correcting pattern 11 having a horizontally-reclined U-shaped style when it is viewed on a flat surface is added to an end of the design pattern Pd so as to surround three sides of the end. Accordingly, the proximity effect correction is carried out.

When a width of the correcting pattern 11 is assumed to be W3, a minimum space width sp3 is narrower by 2*W3 than the minimum space width sp2 in the design, as the result of the addition of the correcting pattern 11. Here, the space width implies a width in a left and right direction of FIG. 1 (an extending direction of the design pattern Pd), and the pattern width implies a width in an upper and lower direction of FIG. 1.

In the above-mentioned case, a mask on which the proximity effect correction is performed has a problem that a resolution is deteriorated when the mask is transcribed. The original design pattern Pd at the beginning of the design is designed such that the space (sp2) between the design patterns Pd is not smaller than a space corresponding to a practical resolution of an exposing apparatus, in accordance with the minimum design rule. Here, the practical resolution of the exposing apparatus implies a resolution when the exposing apparatus exposes a pattern. However, after the proximity effect correction, the minimum space width (sp3= sp2−2*W3) between the correcting patterns 11 is not smaller than the space corresponding to the practical resolution.

Figure 2:
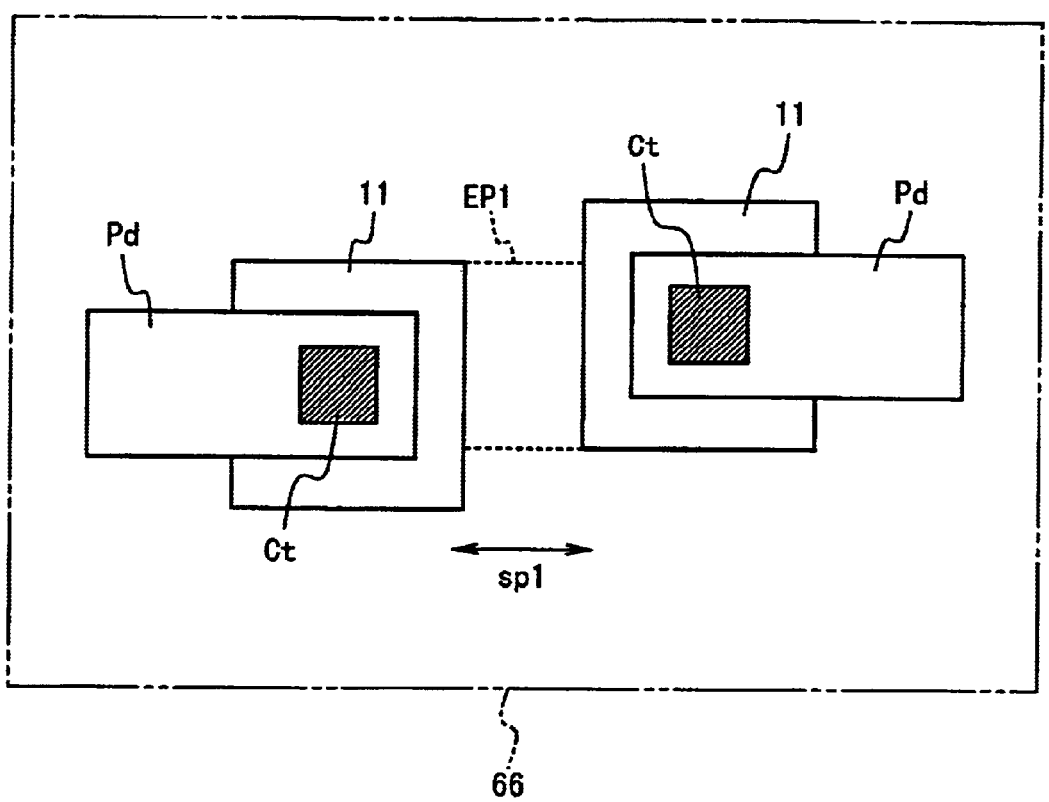
FIG. 2 is a plan view showing another step of the first embodiment.
Figure 3:
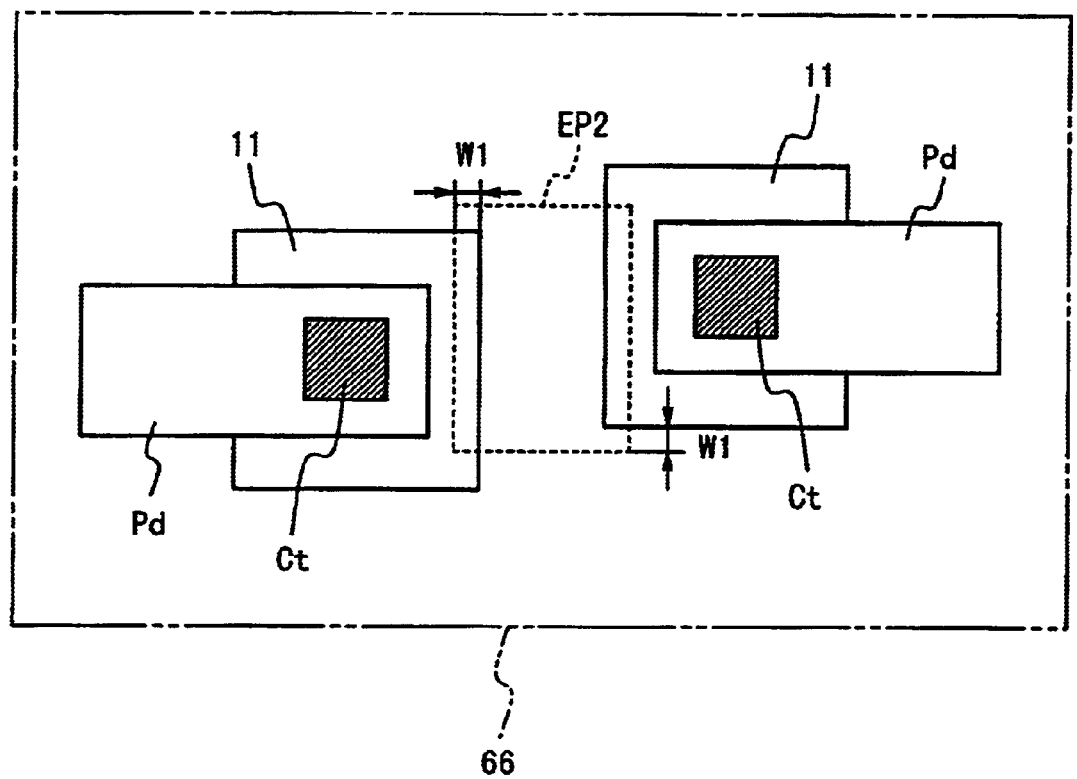
FIG. 3 is a plan view showing still another step of the first embodiment.

At first, as shown in FIG. 2, the proximity effect correcting mask in which the correcting pattern 11 is added to the design pattern Pd is detected for the space width between the correcting patterns 11. As the detected result, a portion where the space width between the correcting patterns 11 is equal to or less than a predetermined space width sp1 is extracted as an error pattern 1 (EP1). As shown in FIG. 3, the space width and the pattern width of the error pattern 1 are expanded by a certain width W1 to generate an error pattern 2.

Figure 4:
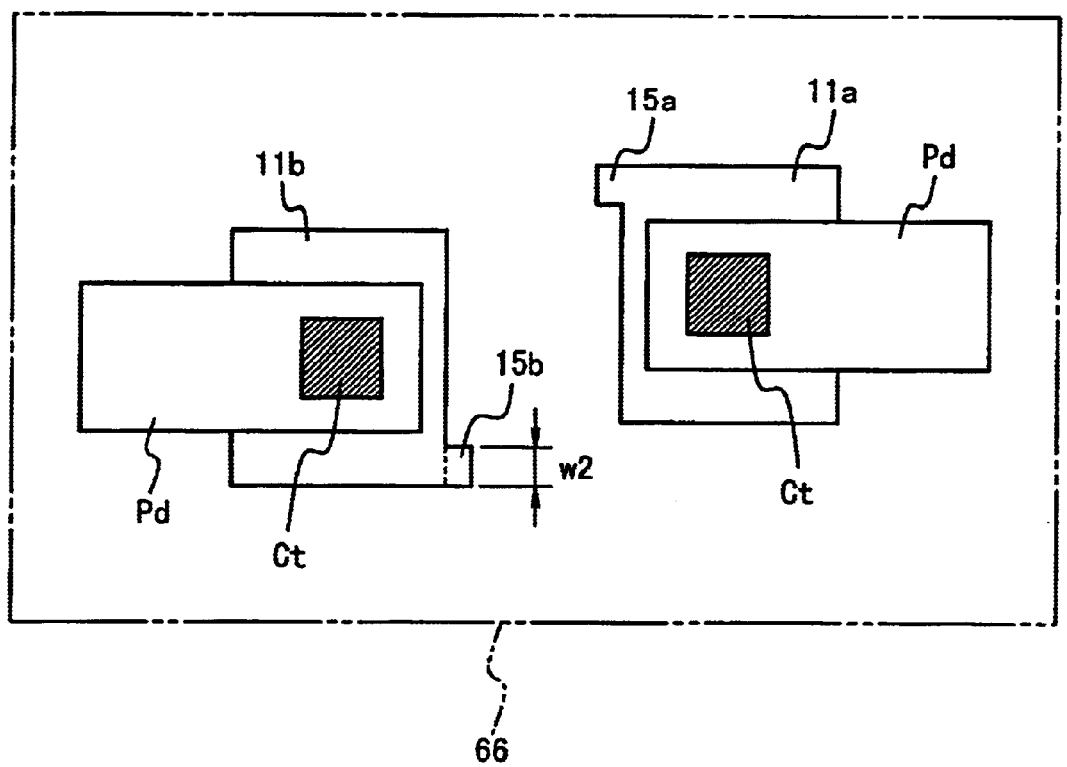
FIG. 4 is a plan view showing still another step of the first embodiment.

As shown in FIG. 4, a portion overlapping with the error pattern 2 is removed from the correcting patterns 11, 11. Thus, the correcting patterns 11, 11 are modified so as to enlarge the space width between the correcting patterns 11 (the modified correcting patterns are denoted by symbols 11a, 11b). Accordingly, in the space between the correcting patterns 11a, 11b, the deterioration of the resolution in the mask transcription is protected without being smaller than the space corresponding to the practical resolution of the exposing apparatus.

At a next step, the computer 66 assumes these correcting patterns 11a, 11b to be modified wiring portions, and adds the modified wiring portions 11a, 11b to the design patterns Pd to generate a modified wiring pattern. The computer 66 stores the modified wiring pattern in a modified layout data memory section (not shown) in the computer 66.

At a next step, the computer 66 generates a mask drawing data based on the modified wiring pattern. Here, a method of determining a width Lk of the correcting pattern 11 (refer to FIG. 10) and a method of calculating a value of the certain width W1 are described with reference to FIG. 5.

Figure 5:
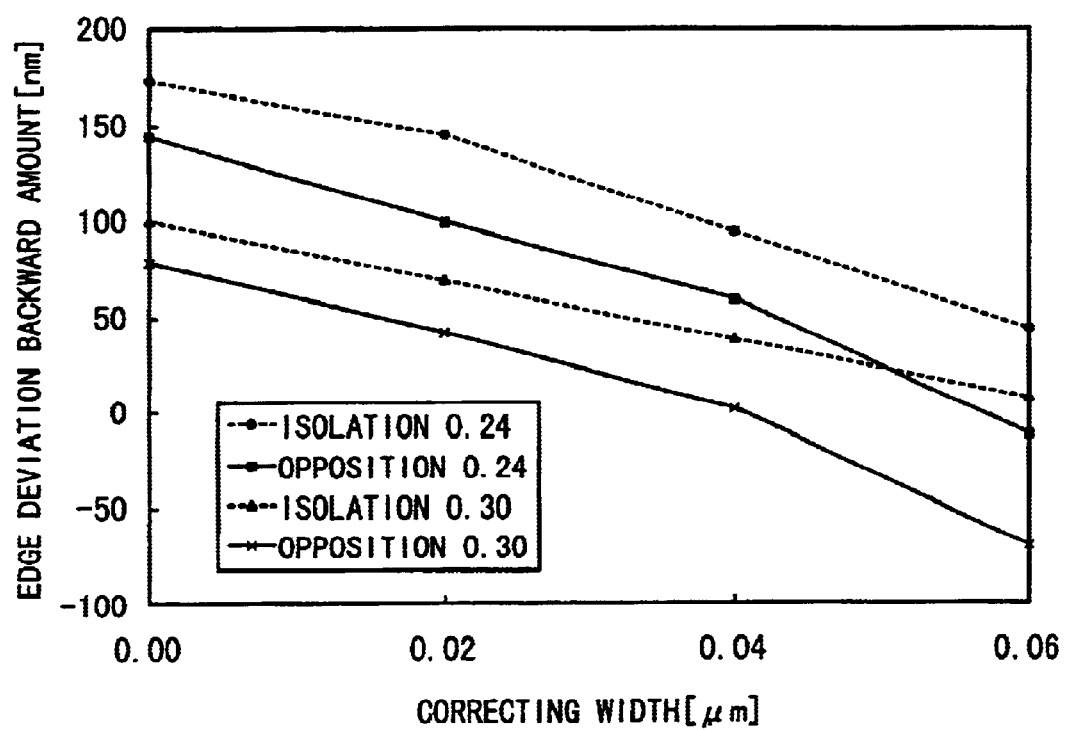
FIG. 5 is a graph showing a relation between a edge deviation backward amount and a correcting width in the first embodiment.
Figure 9:
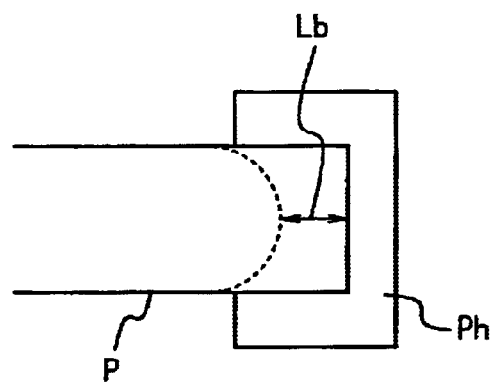
FIG. 9 is a plan view describing a parameter in the graph of FIG. 5.

A graph of FIG. 5 shows a change of an edge deviation backward amount in a correcting width. In the graph of FIG. 5, a vertical axis indicates the edge deviation backward amount (nm). Here, as shown in FIG. 9, the edge deviation backward amount implies an amount Lb reduced (deviated) from a design pattern P, when the design pattern P to which a correcting pattern Ph is added is reduced (deviated) by the optical proximity effect after the exposure transcription. A edge deviation backward amount Lb of 0 implies a situation that the correcting is optimally carried out and thereby a desired pattern is attained after the exposure transcription. In short, the edge deviation backward amount Lb of 0 implies a situation that only a portion of the correcting pattern Ph is reduced (deviated).

Figure 10:
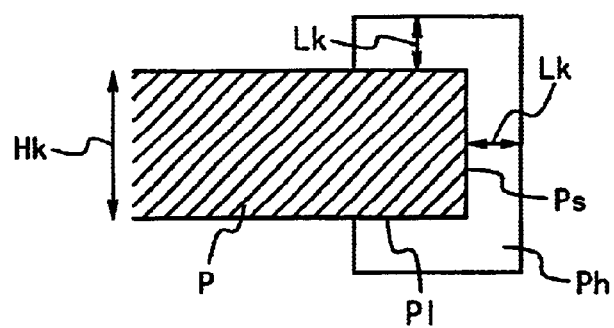
FIG. 10 is a plan view describing the parameter in the graph of FIG. 5.

A horizontal axis in the graph of FIG. 5 shows the correcting width (μm). Here, the correcting width implies a width Lk of the correcting pattern Ph added to the design pattern P as shown in FIG. 10. The correcting pattern Ph is generated in a single horizontally-reclined U-shaped style when it is viewed on a flat surface. The correcting pattern Ph has the same separation distances Lk from a short side Ps and a long side Pl of the design pattern P, respectively.

Figure 11:
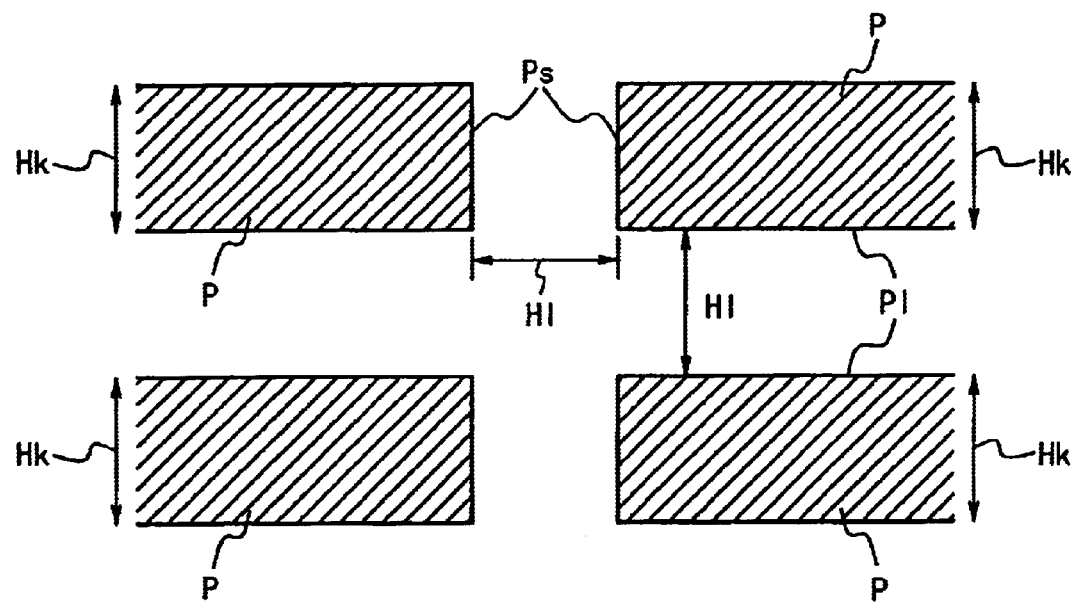
FIG. 11 is a plan view describing the parameter in the graph of FIG. 5.

In FIG. 5, the parameter includes a combination of an arrangement situation of the design pattern P and a wiring width Hk of the design pattern P. Namely, [Isolation 0.24] indicates that the design pattern P is singly arranged as shown in FIG. 10 and a wiring width Hk of the design pattern P is 0.24 μm. [Opposition 0.30] indicates that as shown in FIG. 11, the design patterns P are arranged opposite to each other and each wiring width Hk of these design patterns P is 0.30 μm. In this opposite arrangement, a distance Hl between the short sides Ps of the design patterns P and a distance Hl between the long sides Pl thereof are both a value defined in accordance with the minimum design rule (for example, 0.24 μm).

The values of the width Lk of the correcting pattern 11 and the certain width W1 are determined from the following viewpoints. The wiring width Hk and the arrangement state (the isolation or the opposition) of the design pattern P (Pd) are not uniform. Thus, the values are determined so as to give a desirable situation in which the edge deviation backward amount is small, to the design patterns P in all cases.

As shown in FIG. 5, in the states of [Isolation 0.24], [Opposition 0.30] and [Isolation 0.30], when the width Lk of the correcting pattern 11 is [0.06 μm], the edge deviation backward amounts are all closer to [0]. For example, in a case of [0.24 μm Width Isolation Pattern], when the correcting width is [0.06 μm], the edge deviation backward amount is reduced to 50 nm. Thus, at first, the widths Lk of the correcting patterns 11 are uniformly set to [0.06 μm].

However, in the case of, a 70 nm pattern is conversely expanded when the correcting width is. In short, this results in an over correction. The wiring pattern is generated at a position exceeding a design (pattern) value in a direction opposite to a deviated direction to thereby drop the resolution. Thus, the pattern cannot be resolved by a small variation of an exposure amount.

Thus, if the examples shown in FIGS. 2 to 4 are [0.30 μm Width Opposition Pattern], the certain width W1 is set to [0.02 μm]. Accordingly, the width Lk of the correcting pattern 11 is reduced from the original 0.06 μm to 0.04 μm. The edge deviation backward amount becomes 0 (satisfying the pattern value). Hence, an erroneous connection to opposite other wiring patterns is avoided.

Here, the step for detecting the space width between the correcting patterns 11 shown in FIG. 2 is performed to check whether or not the design pattern Pd (P) is at the [opposite] state. As shown in FIG. 4, after the correcting pattern 11 is modified, micro projections 15a, 15b remain in the ends of the modified correcting patterns 11a, 11b. These projections 15a, 15b may be detected, for example, as dust adhered to the mask, when the defect of the mask is detected (as pseudo defect). This results in a factor of disturbing the excellent detection of the mask defect.

The reason why the projections 15a, 15b may easily lead to the pseudo defect when the mask defect is detected is as follows. The sizes of the projections 15a, 15b on the mask pattern are micro and also equal to or smaller than the practical resolution when the mask is manufactured. Thus, a difference between a photographed image and a reference pattern before the mask transcription is detected as a large difference, because of the severe deterioration of the pattern form in the mask transcription and the limitation on the resolution in a photographing device, such as a CCD camera and the like, for the mask defect detection.

Then, in the first embodiment, a portion where a pattern width is equal to or less than a certain width W2 is extracted from the modified correcting patterns 11a, 11b. The portion is removed from the modified correcting patterns 11a, 11b. Accordingly, the defect of the mask can be easily detected without erroneously detecting the pseudo defect.

That is, the first embodiment discloses the following technique. A portion where the space width between the correcting patterns 11, 11 is equal to or less than a predetermined value sp1 is extracted as an error pattern 1 (EP1) from the proximity effect correcting mask in which the correcting patterns 11, 11 are added to the design patterns Pd, Pd. Next, an error pattern 2 (EP2) is generated in which the error pattern 1 (EP1) is expanded by a certain width W1. Then, a portion overlapping with the error pattern 2 (EP2) is removed from the correcting patterns 11, 11 to thereby modify the space width between the correcting patterns 11, 11. Next, a portion where a pattern width between the modified correcting patterns 11a, 11b is equal to or less than another predetermined value w2 is extracted and then removed from the modified correcting patterns 11a, 11b.

Figure 6:
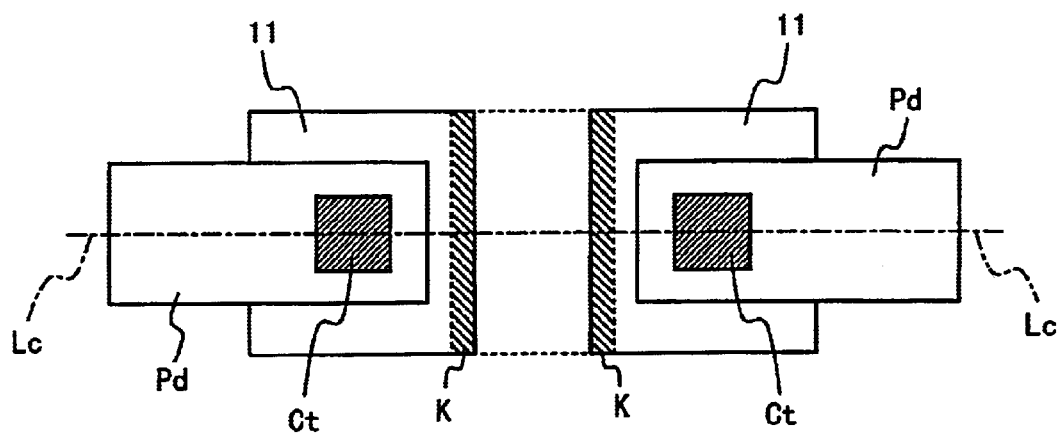
FIG. 6 is a plan view describing a variation of the first embodiment.

The reason why the projections 15a, 15b are generated is that as shown in FIG. 1, axis lines Lc, Lc of the design patterns Pd, Pd opposite to each other are not in line with each other. If the axis lines Lc, Lc of the design patterns Pd, Pd are located on the same line as shown in FIG. 6, the projections 15a, 15b never remain after the removal of the portion overlapping with the error pattern 2 (EP2). In this case, only portions indicated by symbols K are removed, and the projections 15a, 15b do not remain.

In addition to the cases shown in FIGS. 1 to 4 in which the axis lines Lc, Lc of the design patterns Pd, Pd are not in line with each other, the case that the pseudo defect may be detected is considered as follows.

Figure 7:
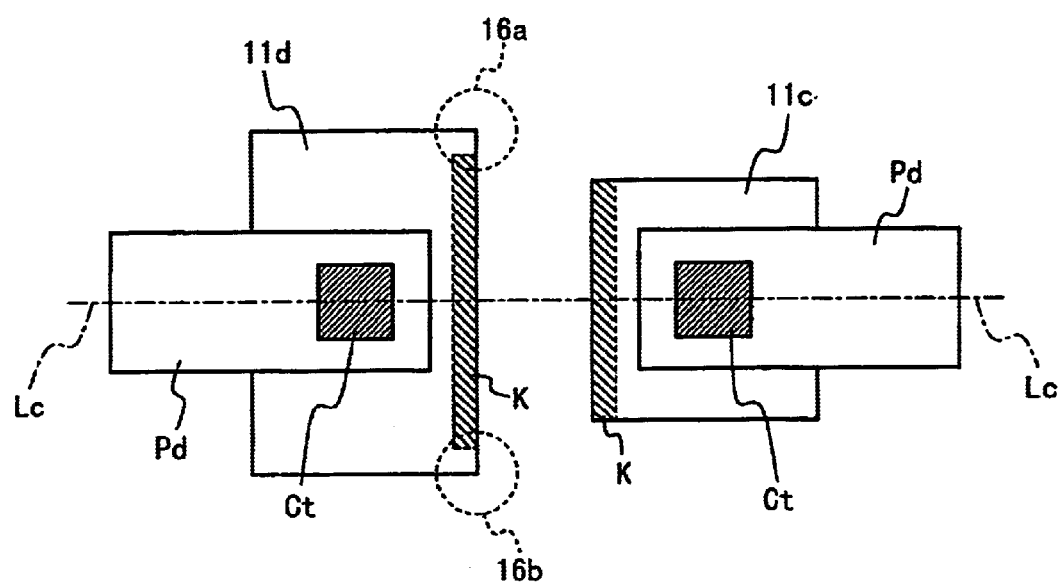
FIG. 7 is a plan view describing a variation of the first embodiment.

Firstly as shown in FIG. 7, though the axis lines of the design patterns Pd, Pd are located on the same line, if the widths of added correcting patterns 11c, 11d are different from each other, minor projections 16a, 16b remain on both sides of the correcting pattern 11d having a larger width after the correcting patterns 11c, 11d are removed partly to be modified. There may be a possibility that the projections 16a, 16b are detected as the pseudo defect. In the case of FIG. 7, the method similar to that of removing the projections 15a, 15b in FIG. 4 may be employed in order to remove the projections 16a, 16b.

Figure 8:
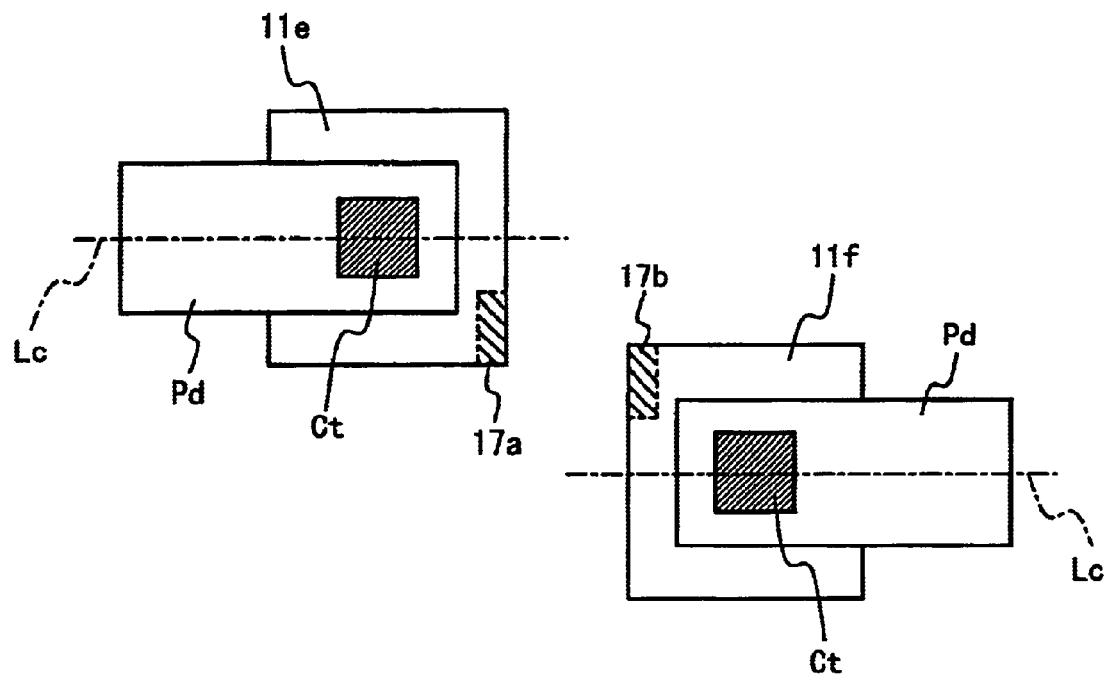
FIG. 8 is a plan view describing a variation of the first embodiment.

Secondly as shown in FIG. 8, the axis lines Lc, Lc of the design patterns Pd, Pd are largely deviated from each other. Consequently, only minor areas indicated by symbols 17a, 17b are removed when the correcting patterns 11e, 11f are removed partly to be modified. At this time, since the removed portions 17a, 17b are minor, it may be considered that an occurrence of "break" (pseudo defect) in the mask is erroneously detected in the mask defect detection. Here, the following manner may be employed so as to avoid the occurrence of the minor removal portions 17a, 17b. In FIG. 2, if a portion where the space width between the correcting patterns is equal to or less than the sp1 is extracted as the error pattern 1 (EP1), the error pattern 1 is removed when the width of the extracted error pattern 1 (pattern width) is equal to or less than the W2. The processes in FIGS. 3 and 4 after that are not carried out. In such a case, the minor removal portions 17a, 17b are never brought about since the removing the correcting pattern is not carried out.

A second embodiment will be described below. In the first embodiment, the correcting pattern 11 having a horizontally-reclined U-shaped style when it is viewed on a flat surface is generated so as to surround the three sides of the ends of the design pattern Pd. Then, the above-mentioned modification is performed on the correcting pattern 11.

On the contrary, a correcting figure described in the second embodiment is added in view of the following background.

Figure 12:
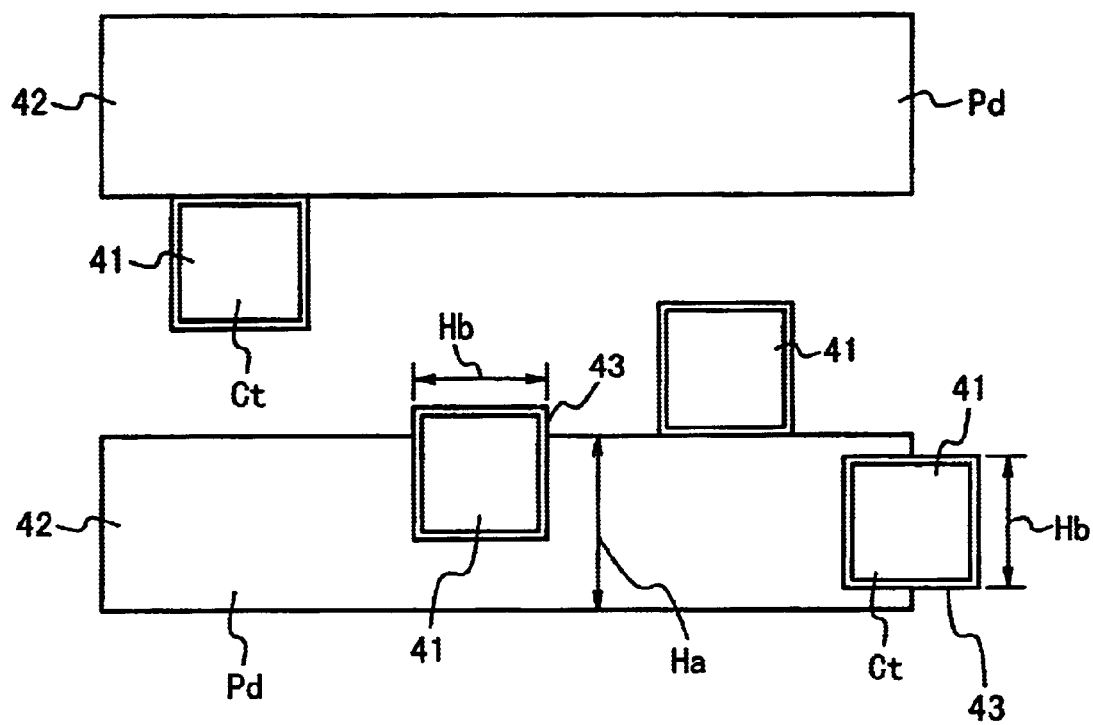
FIG. 12 is a plan view showing a background of a second embodiment of the optical proximity effect correcting method in the semiconductor manufacturing process according to the present invention.

As shown in FIG. 12, a pattern 41 in which the contact Ct and the wiring Pd overlap with each other and a pattern 42 having only the wiring Pd are used to design the pattern, in many cases. In order to connect the contact Ct in the pattern 41 to the pattern 42 of the wiring Pd, the pattern 41 and the pattern 42 may be in contact with each other. Thus, as denoted by a symbol 43, a pattern arrangement may be considered in which only a part of the pattern 41 is projected which has a wiring width Hb different from a wiring width Ha of the wiring pattern 42 and the like. Actually, there may be a design based on such arrangement. However, this causes a pattern 43 in a form of small notch to be brought about.

The inhibition of the pattern in the form of small notch causes the number of CAD check items to be increased. Thus, this cannot be inhibited since an operational speed is made slower. Hence, this causes the occurrence of the pattern arrangement 43 in which the contact Ct is not present in an inline of the pattern 42 at the end of the pattern Pd and the like.

It may be considered to limit the design rule so as not to bring about such a pattern 43. However, the method of limiting the design rule and the method of validating the design rule are not still established. Such limitation and validation may be considered to drop a design efficiency and largely increase a time for the validation process. Thus, the subject is the manner of carrying out the proximity effect correction of the pattern 43 in which only a part of the pattern 41 is projected.

In the second embodiment, the correcting pattern (correcting figure) is added as follows, differently from that of the first embodiment.

Figure 13:
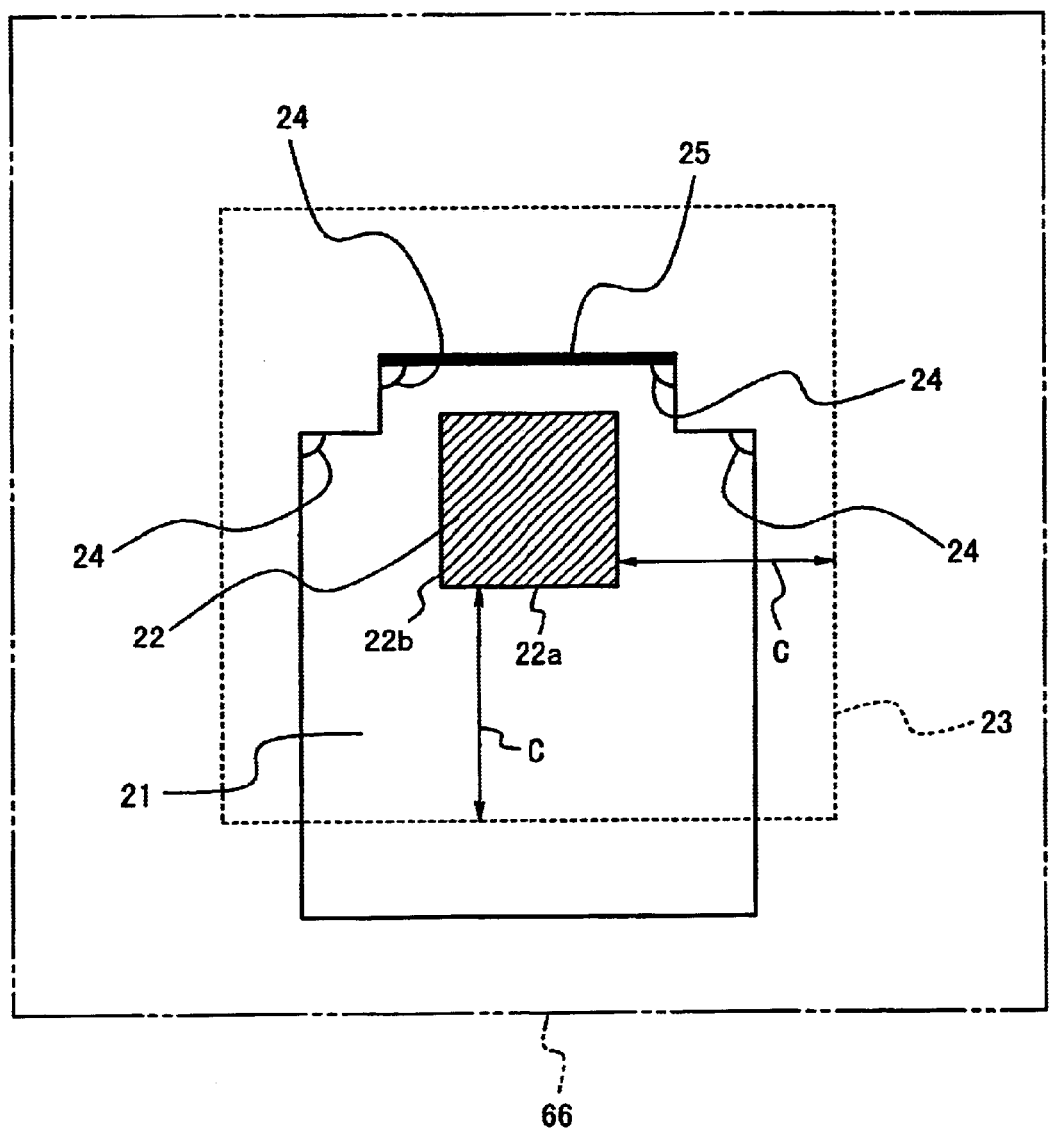
FIG. 13 is a plan view describing the second embodiment.
Figure 14:
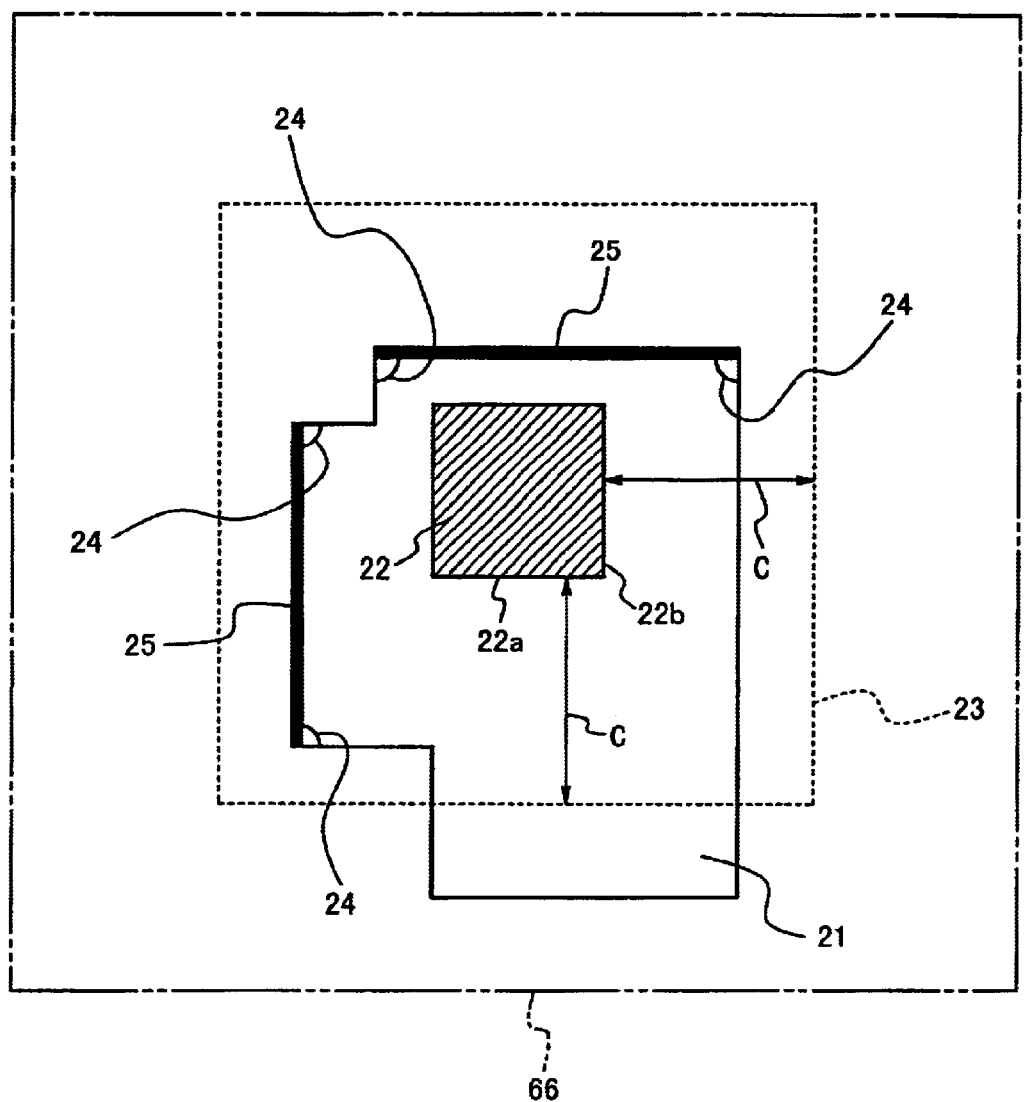
FIG. 14 is another plan view describing the second embodiment.

As shown in FIGS. 13 and 14, the layout data which is not yet modified is stored in the computer 66. The correcting figure is added to the layout data which is not yet modified, by using the following procedure.

As shown in FIGS. 13 and 14, the layout data which is not yet modified includes a wiring 21 which is a wiring layer pattern or an element thereof and a contact 22 which is a contact layer pattern or an element thereof.

(1) At first, at a first step, an area 23 formed by sides separated by a distance C from each of straight specific sides 22a, 22b adjacent to each other in the contact 22 is set as an angle margin area 23.

(2) Next, at a second step, the computer 66 detects angles 24, 24 . . . of 90 degrees of the wiring pattern 21 located in the angle margin are 23.

As the result of the steps (1) and (2), the proximity effect correction is performed on only the angles 24, 24 . . .

belonging to a rectangular annular area 23 in which a width surrounding a square contact 22 is C. Thus, the proximity effect correction is not performed on a wiring portion in which the contact 22 is not present. Accordingly, correcting figures cannot be required in the portion where a contact 22 is not present. Hence, it is possible to reduce the increase of a data size of a mask data.

(3) At a third step, the computer 66 regards a side 25 between the detected angles 24, 24 . . . as an end side 25 of the wiring pattern 21.

Figure 15:
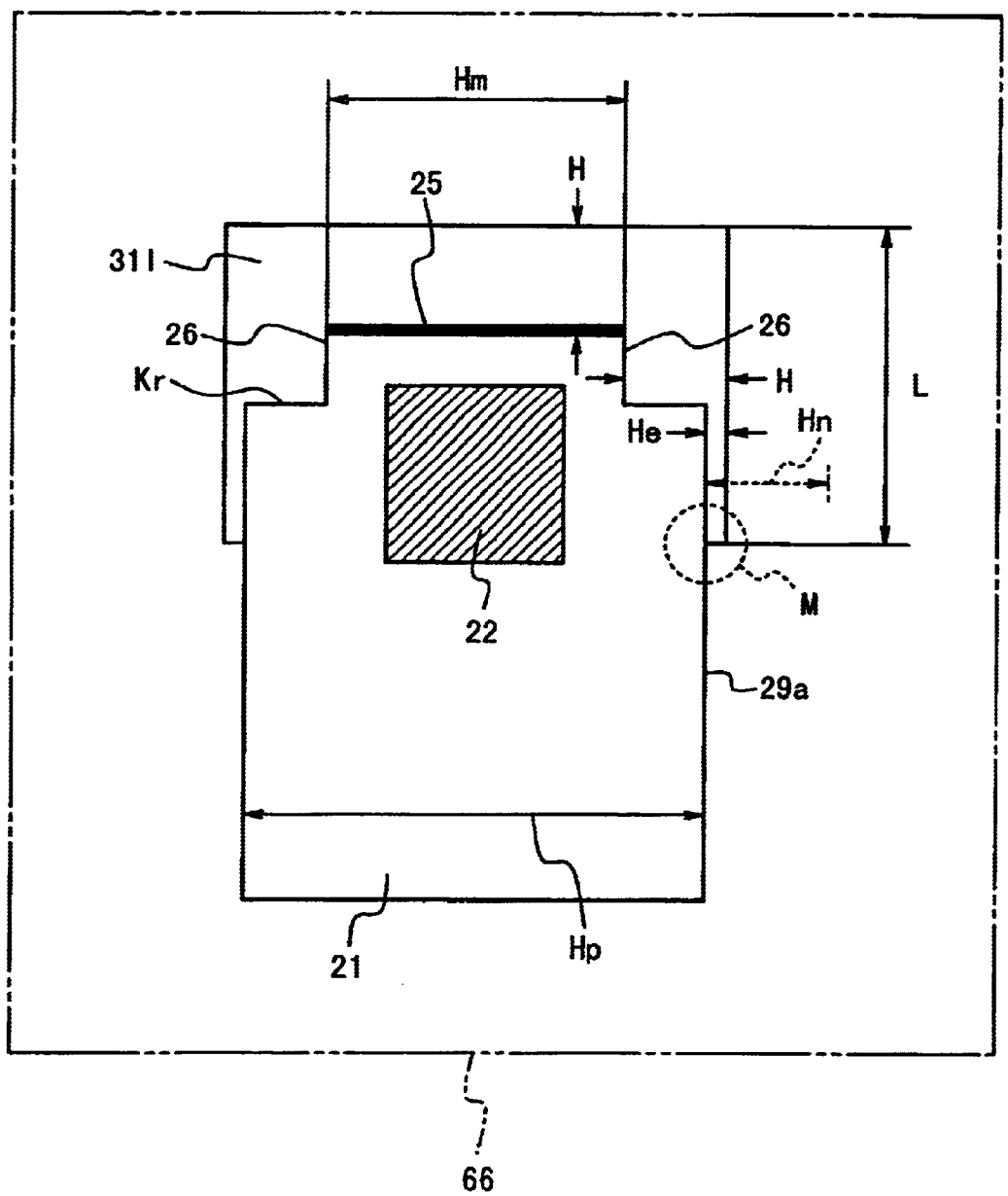
FIG. 15 is still another plan view describing the second embodiment.
Figure 16:
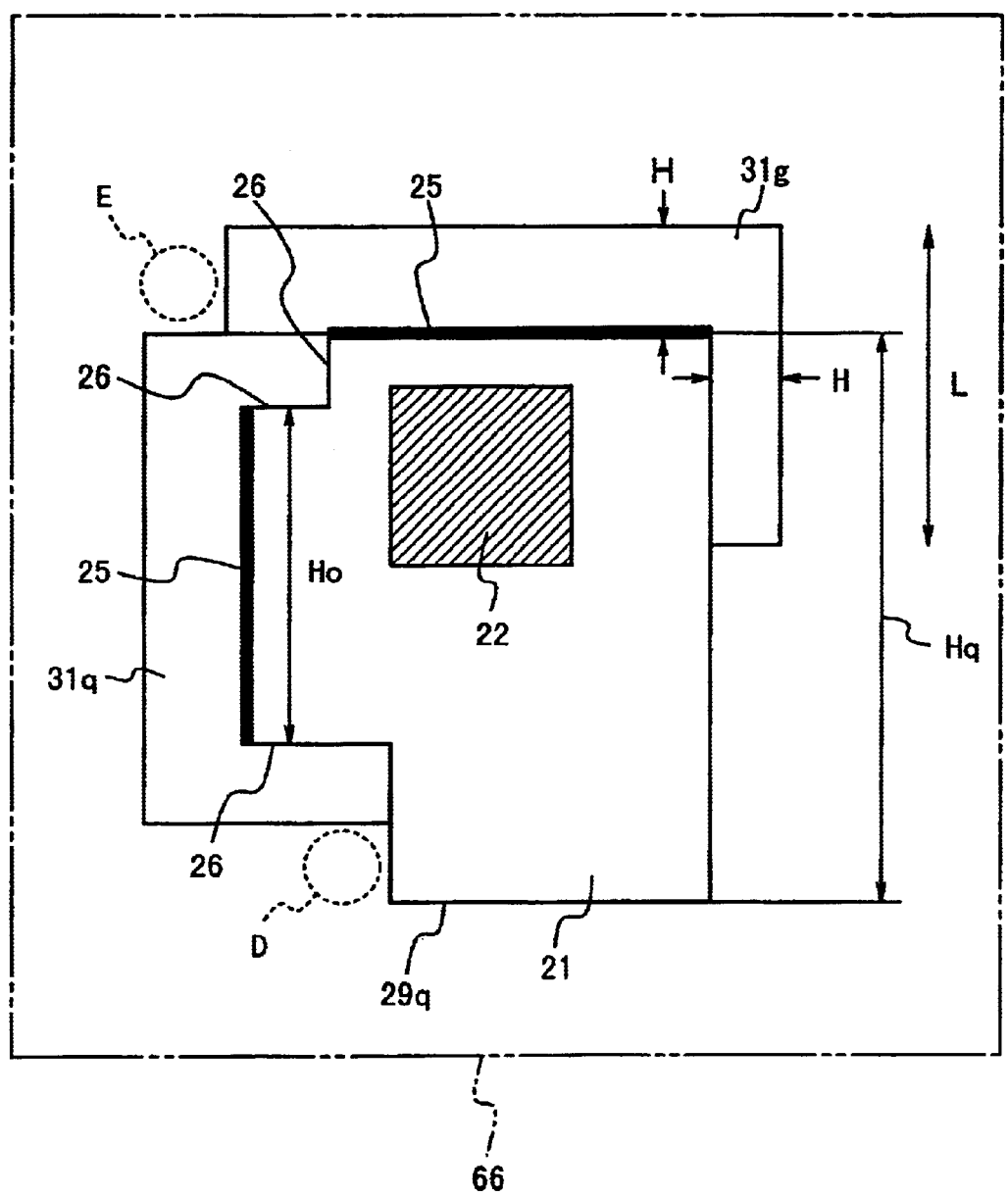
FIG. 16 is still another plan view describing the second embodiment.

(4) At a fourth step, as shown in FIGS. 15 and 16, the computer 66 adds correcting figures. 31g, 31l, 31q each of which has a predetermined width H and a predetermined length L, to each of the end side 25 and sides 26, 26 . . . adjacent to the end side 25.

(5) At a fifth step, the computer 66 assumes these correcting figures. 31g, 31l, 31q to be modified wiring portions, and adds the modified wiring portions 31g, 31l, 31q to the wiring pattern 21 to generate a modified wiring pattern. The computer 66 stores the modified wiring pattern in a modified layout data memory section (not shown) in the computer 66.

(6) At a sixth step, the computer 66 generates a mask drawing data based on the modified wiring pattern.

Also, as shown in FIG. 15, if the notch is not tentatively present, a width from a side 29a of the wiring pattern 21 is, for example, about 0.06 μm (refer to a symbol Hn), in the correcting figure 31l. However, in the example of FIG. 15, the correcting figure 31l is set on the basis of a width Hm, of the end side 25, shorter than a width Hp of the wiring pattern 21. Thus, the added correcting figure 31l has a width He, which is about 0.01 and 0.02 μm from the side 29a.

There may be a case that a portion M, of the correcting figure 31l, which is about 0.01 to 0.02 μm from the side 29a of the wiring pattern 21 is not recognized as a part of the correcting figure 31l when the mask defect is detected and that it is erroneously detected as dust. In this case, a projection width He (0.01 to 0.02 μm in the example of FIG. 15) from the side 29a in the correcting figure 31l is not constant, since it is varied in accordance with a difference between the wiring width Hp and the width Hm of the end side 25 (a notch Kr of the end of the wiring pattern 21). This fact causes the detection of the mask defect to be further difficult.

Also, as shown in FIG. 16, there may be a case that an area which is not covered by the correcting figures 31g, 31q as indicated by a symbol E occurs in a portion where the correcting figure 31q and the correcting figure 31g are adjacent to each other, because of the relation between the two end sides 25, 25. Also, this area E may be erroneously recognized as "break" in an inspection of the mask. Similarly, the above-mentioned area D may be erroneously recognized as "break" in the inspection of the mask.

So, the second embodiment discloses the following technique. If the end of the wiring pattern 21 is corrected, a correcting figure 31 is generated on the basis of a side of a pattern generated without consideration of the minor irregularities (a part of a contact pattern 22 and the like) located at the end of the wiring pattern 21.

Figure 17:
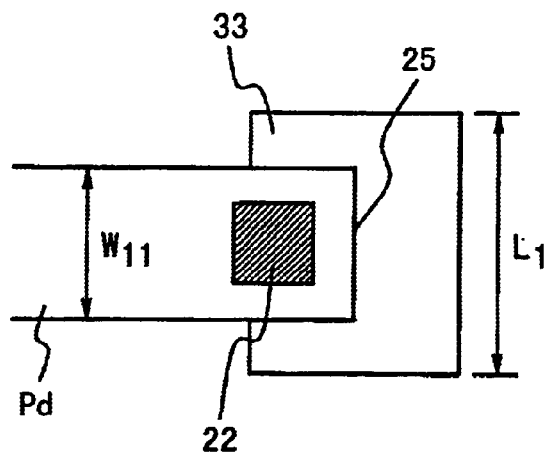
FIG. 17 is still another plan view describing the second embodiment.
Figure 18:
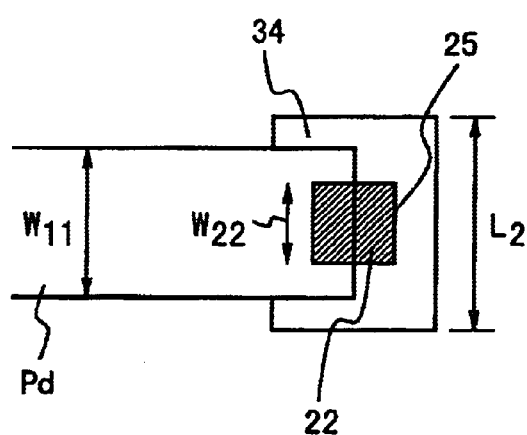
FIG. 18 is still another plan view describing the second embodiment.

In short, as shown in FIG. 17, a correcting figure 33 having a length L1 is added to a wiring pattern Pd having a wiring width W11 originally. On the contrary, as shown in FIG. 18, if only a part of a wiring 22 and a contact are projected from an end of the pattern wiring Pd, a size of a correcting figure 34 is determined on the basis of a width W22 of the projected contact 22 (as an end side 25 of the wiring pattern Pd). Thus, only the correcting figure 34 having a length L2 (L2<L1) is added. Hence, in the case shown in FIG. 18, the size of the correcting figure is determined on the basis of the width W11 of the wiring pattern, and it is not determined on the basis of the width W22 of the projected contact 22.

The second embodiment will be described below in detail with reference to FIGS. 19 to 21.

Figure 19:
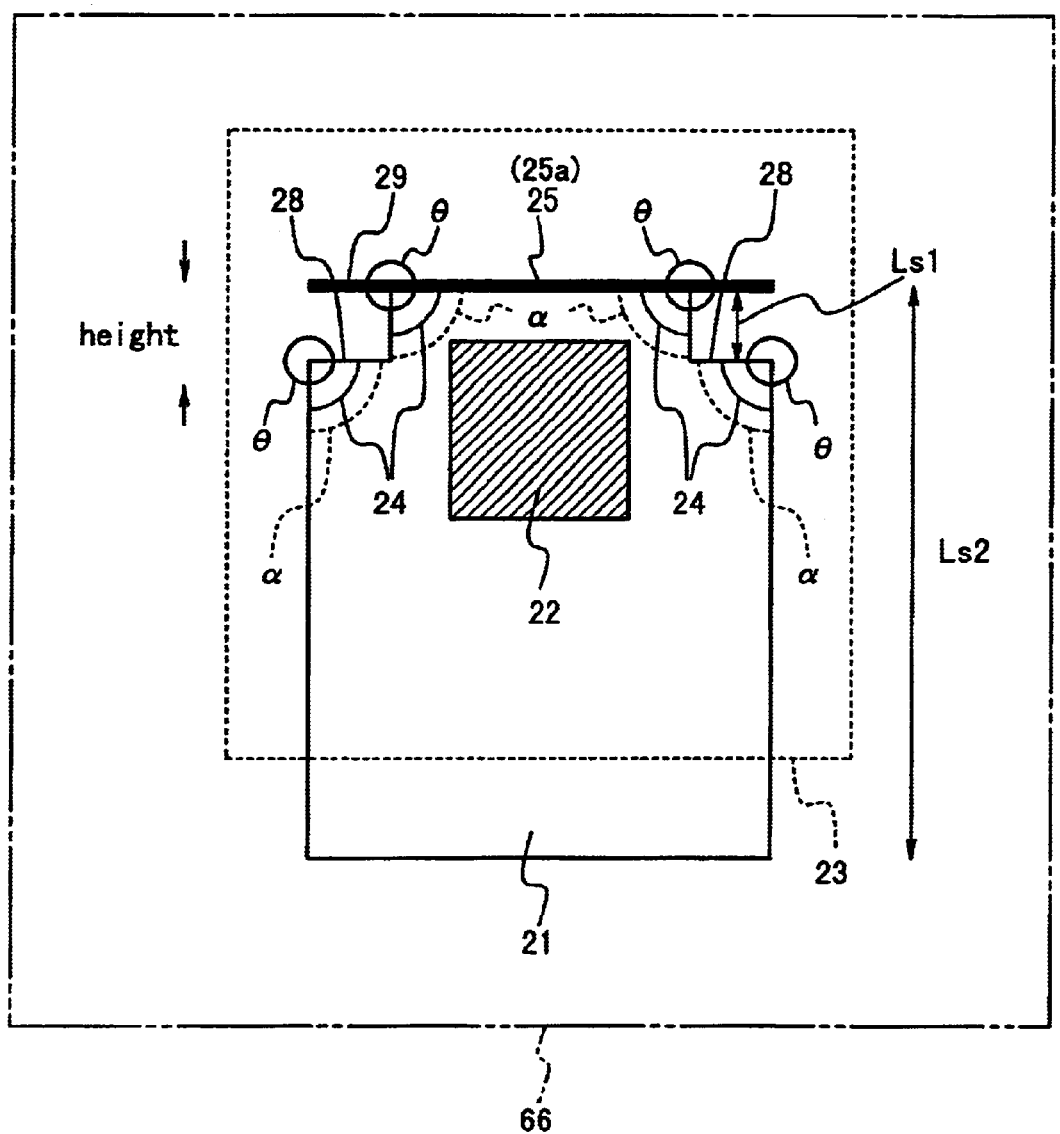
FIG. 19 is a plan view describing a step of the second embodiment.
Figure 20:
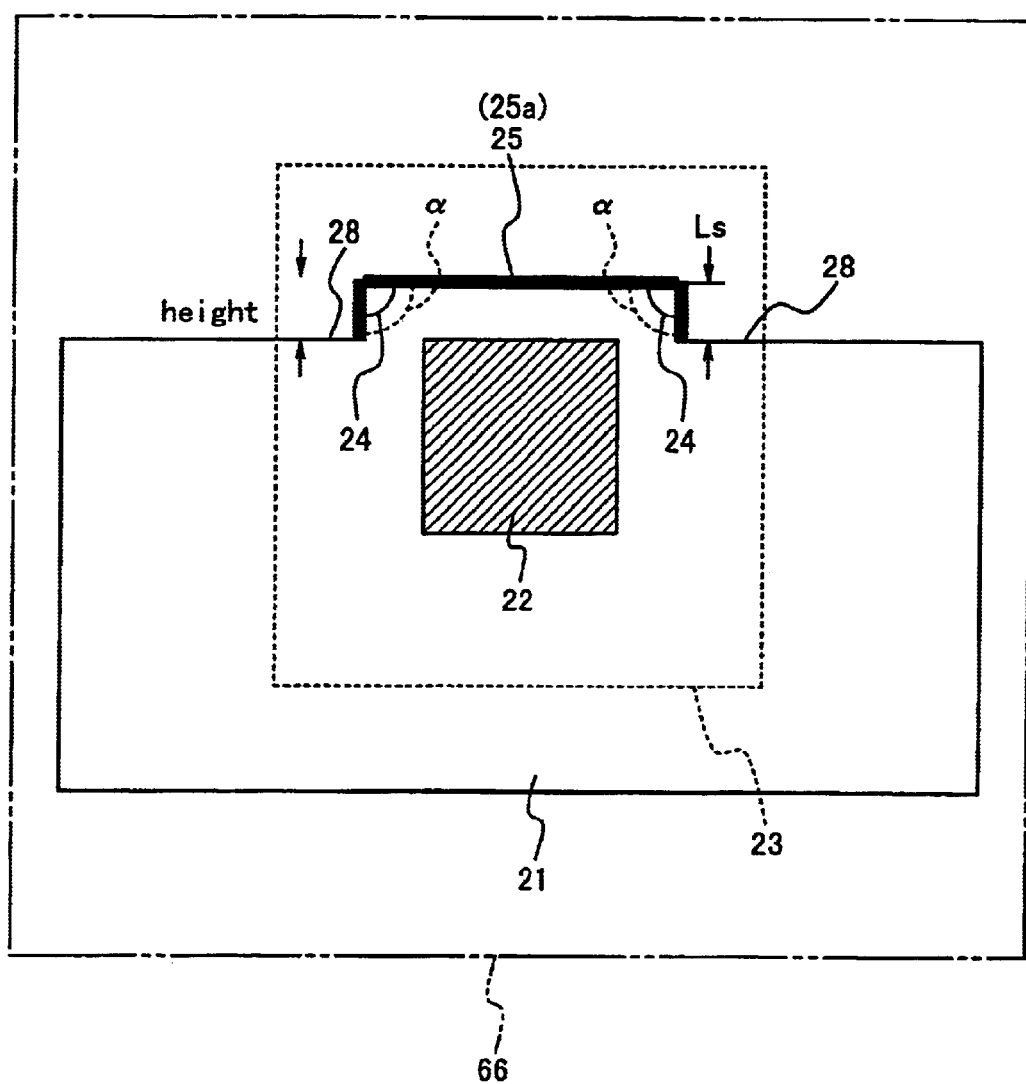
FIG. 20 is another plan view describing a step of the second embodiment.
Figure 21:
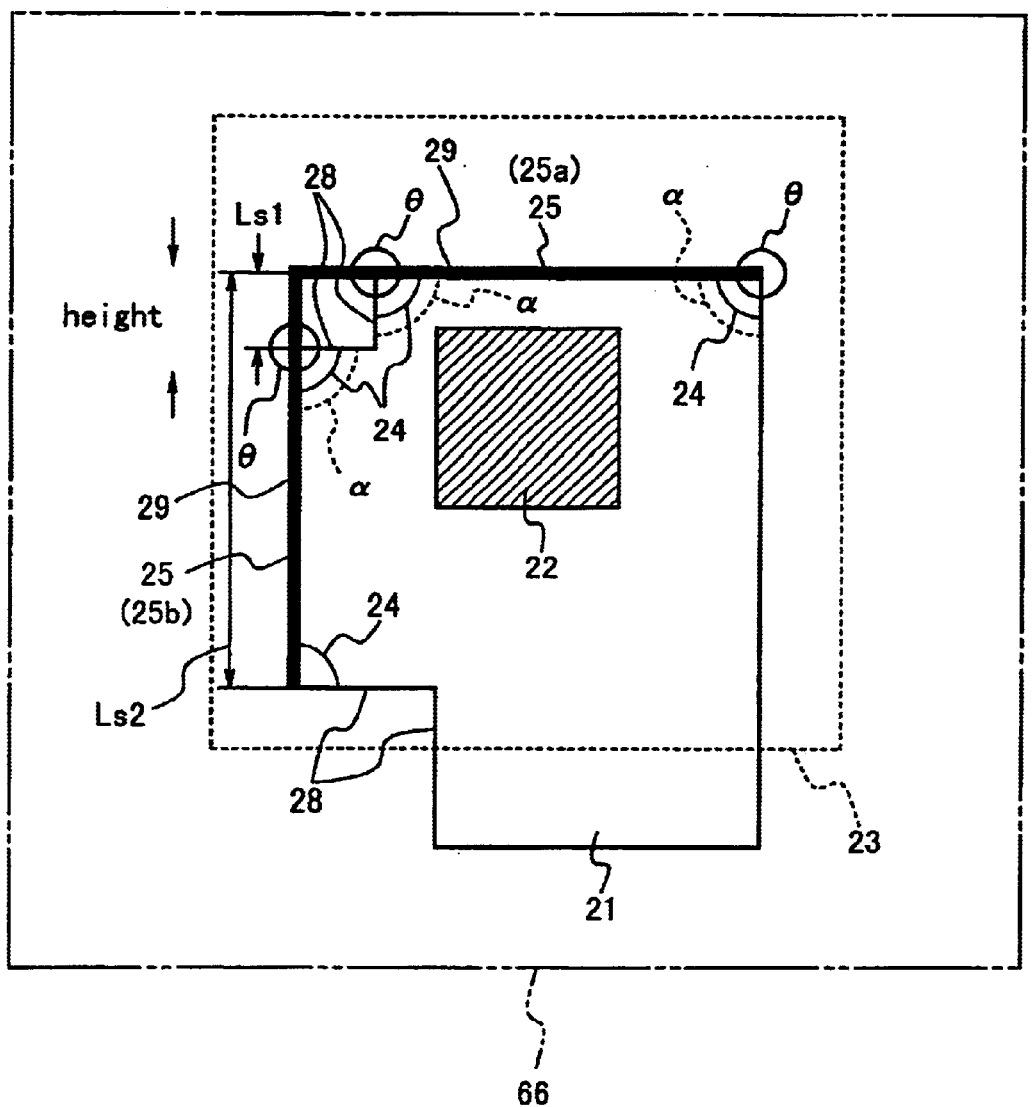
FIG. 21 is still another plan view describing a step of the second embodiment.

(1) As shown in FIGS. 19 to 21, a conventional method is firstly used to specify an angle margin 23 on the basis of a contact pattern 22.

(2) Angles 24, 24 . . . of a wiring pattern 21 in this specified angle margin 23 are detected.

(3) A side 25 between the detected angles 24, 24 . . . is assumed to be an end side 25. In FIGS. 19 and 20, a single end side 25 is detected. And, two end sides 25 (25a, 25b) are detected in FIG. 21. The items (1) to (3) are identical to those of the conventional method.

(4) As shown in FIGS. 19 to 21, a side 28 parallel to a single noted end side 25 (25a) is searched in the angle margin 23.

(5) An inner angle α of 90 degrees on the noted end side 25 (25a) or the parallel side 28 is searched. Here, the inner angle implies that a vertex of the angle (a convex portion of the angle) looks toward an upper side (a left upper side or a right upper side) in FIGS. 19 to 21 and that a lower side (a left lower side or a right lower side) is excluded.

(6) It is judged whether or not lengths Ls1, Ls2 of vertical sides in contact with the noted end side 25 (25a) or the parallel side 28 are equal to or greater than a predetermined value "height". Here, the vertical side points out a side extending in an upper and lower direction in FIGS. 19 to 21, and implies that a side extending in a left and right direction is excluded. Here, the predetermined value "height" is, for example, 0.04 μm.

(7) If the lengths Ls (Ls1, Ls2) of the vertical sides are equal to or greater than the predetermined value "height", the inner angle α in contact with the vertical side is recognized as a reference angle θ. Here, the length Ls1 in FIGS. 19 and 21 and the length Ls in FIG. 20 fall below the predetermined value "height". Thus, the inner angle α in contact with the sides having these lengths Ls1, Ls is not recognized as the reference angle θ. The length Ls2 in FIGS. 19 and 21 is equal to or greater than the predetermined value "height". Thus, the inner angle α in contact with the side having the length Ls2 is recognized as the reference angle θ.

(8) Next, as shown in FIGS. 19 and 21, the end side 25 (25a, 25b) is extended to a position corresponding to the reference angle θ in an extending direction of the end side 25 (25a, 25b). Then, the extended side is defined as a correcting reference side 29.

Figure 22:
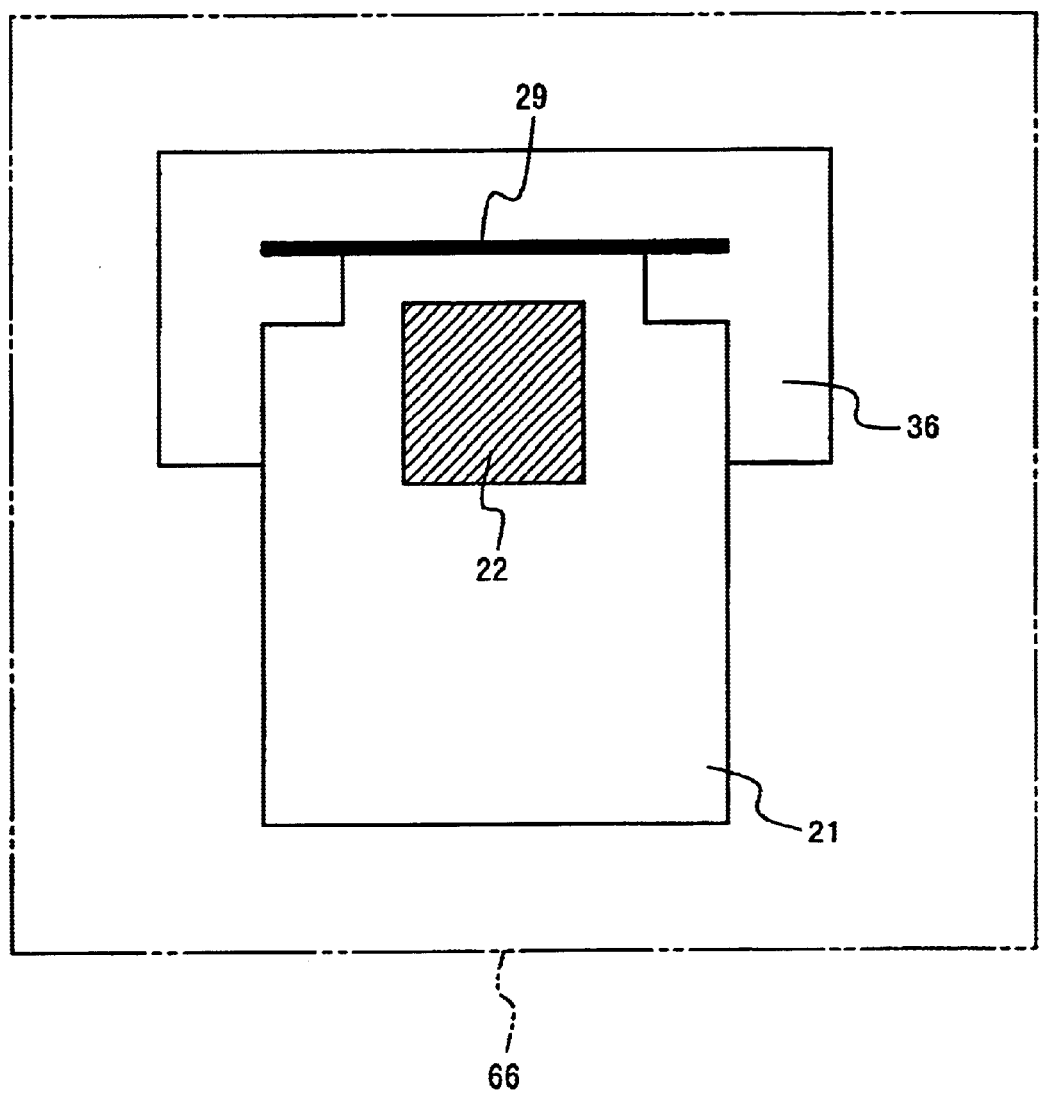
FIG. 22 is a plan view describing another step of the second embodiment.
Figure 23:
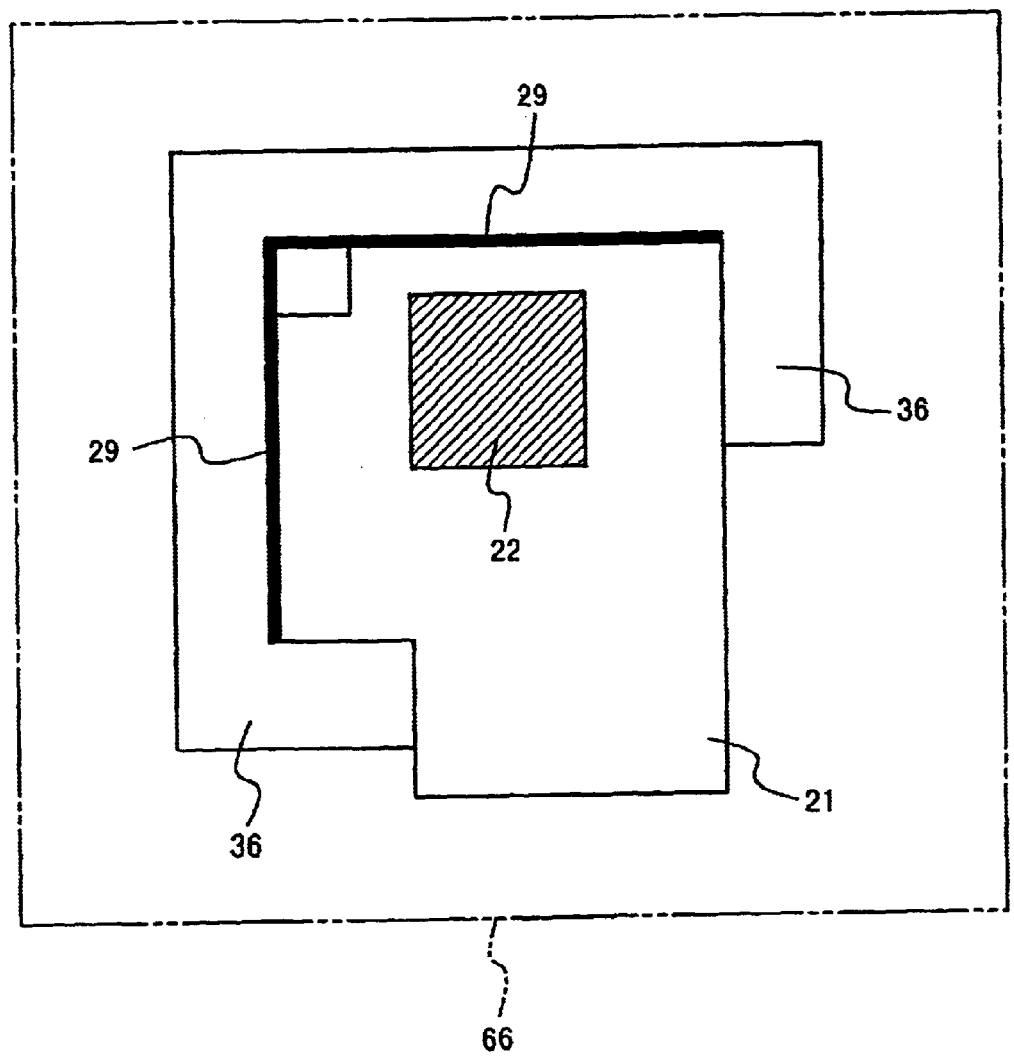
FIG. 23 is another plan view describing another step of the second embodiment.

(9) A correcting figure 36 is added by using the conventional method, on the basis of this correcting reference side 29. The correcting figure 36 generated on the basis of the correcting reference side 29 is shown in FIGS. 22 and 23. FIG. 22 in which FIG. 15 is modified corresponds to FIG. 19. And, FIG. 23 in which FIG. 16 is modified corresponds to FIG. 21.

(10) At a next step, the computer 66 assumes the correcting figure 36 to be a modified wiring portion, and then adds the modified wiring portion to the wiring pattern 21 to generate a modified wiring pattern. The computer 66 stores the modified wiring pattern in the modified layout data memory section (not shown) in the computer 66.

(11) At a next step, the computer 66 generates a mask drawing data based on the modified wiring pattern.

The above-mentioned steps enable the influence resulting from the minor irregularities at the end of the pattern to be removed and also enable the adequate proximity effect correction.

Here, as shown in FIG. 20, if the reference angle θ is not present as the results of the steps (6) and (7), the correcting figure is not added. The reason why the correction is not carried out if the length Ls is equal to or less than the predetermined value "height" as shown in FIG. 20 is described.

Figure 24:
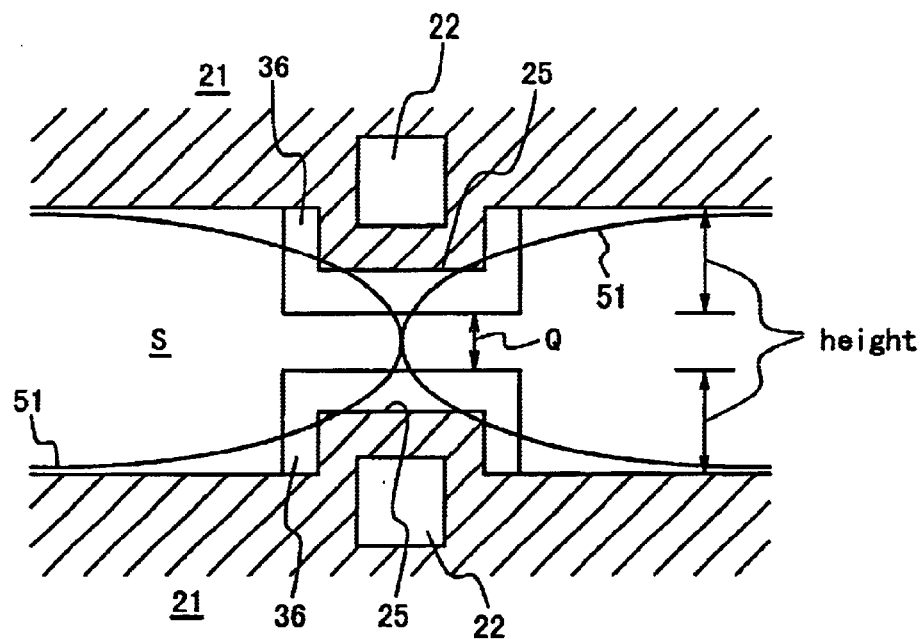
FIG. 24 is a plan view describing the second embodiment.

As shown in FIG. 24, if the wiring patterns 21 in which projection amounts of the end sides 25 as shown in FIG. 20 are equal to or less than the predetermined value "height" are opposite to each other, the addition of the correcting figure 36 brings about the excessive correction to thereby result in the connection in which it is embedded in a part of a gap S between the wiring patterns 21 (refer to a symbol 51).

Figure 25:
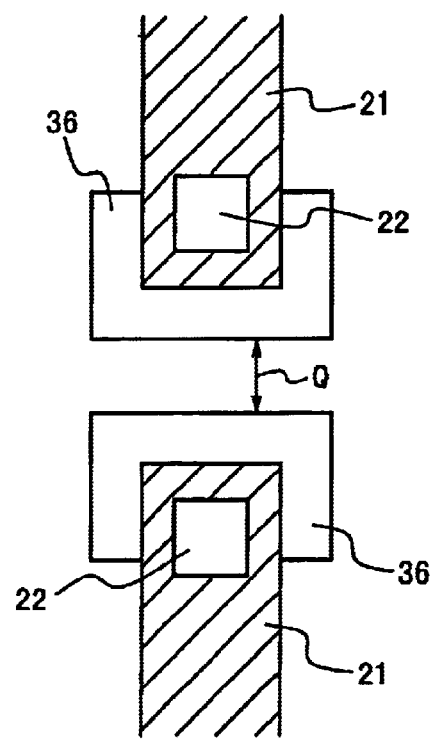
FIG. 25 is another plan view describing the second embodiment.

This is described in comparison with the case in which a distance between correcting figures 36, 36 opposite to each other as shown in FIG. 25 is Q identical to that of FIG. 24. In FIG. 24, the wiring patterns 21, 21 are opposite to each other in a wide range as compared with the case of FIG. 25. So, the gap S is formed in the portion where they are opposite to each other in this wide range. Accordingly, they may be easily connected so as to embed a part of the gap S.

The optical proximity effect correcting method in the semiconductor manufacturing process according to the present invention is provided with: adding a first correcting region (11) around a portion of a first design pattern (Pd), the portion facing a second design pattern (Pd), and a first corrected design pattern including the first correcting region (11) and the first design pattern (Pd); detecting a space between the first corrected design pattern and the second design pattern (Pd); judging whether the space is smaller than or equal to a predetermined value (sp1); and deleting at least a portion of the first correcting region (11) such that the space is larger than the predetermined value (sp1), when the space is smaller than or equal to the predetermined value (sp1). Thus, there is no case that the interval falls below the practical resolution of the exposing apparatus. Hence, the deterioration of the resolution can be avoided in the mask transcription.

What is claimed is:

1. A mask data forming method in a semiconductor manufacturing process, comprising:

adding a correcting region to a design pattern based on a first data indicating at least a portion of said design pattern to form a first corrected pattern;

correcting said correcting region based on a second data different from said first data to form a second corrected pattern;

generating a mask data based on said second corrected pattern; and detecting a defect of said mask data, and wherein said correcting includes correcting said correcting region such that a data indicating one of a projection portion and a concave portion which are smaller than a predetermined size, is not detected as said defect.

2. A mask data forming method according to claim 1, wherein said design pattern comprises a wiring layer pattern.

3. A mask data forming method according to claim 1, wherein said design pattern comprises a contact layer pattern.

* * * * *